US006859469B2

(12) United States Patent
Hedin et al.

(10) Patent No.: US 6,859,469 B2
(45) Date of Patent: Feb. 22, 2005

(54) METHOD AND APPARATUS FOR LASER WAVELENGTH STABILIZATION

(75) Inventors: Gunnar Hedin, Tyreso (SE); Johan Tegin, Bromma (SE)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 10/014,277

(22) Filed: Dec. 11, 2001

(65) Prior Publication Data

US 2003/0108071 A1 Jun. 12, 2003

(51) Int. Cl.$^7$ .............................. H01S 3/098; H01S 3/13
(52) U.S. Cl. .......................................... 372/32; 372/18
(58) Field of Search .............................. 372/18, 32, 20; 359/334

(56) References Cited

U.S. PATENT DOCUMENTS

| | | | |
|---|---|---|---|
| 3,612,691 A | 10/1971 | Schwartz | 356/106 |
| 4,170,416 A | 10/1979 | Fencil | |
| 4,173,442 A | 11/1979 | Snyder | |
| 4,515,478 A | 5/1985 | Ballard et al. | |
| 4,566,794 A | 1/1986 | Hanse | |
| 4,896,325 A | 1/1990 | Coldren | |

(List continued on next page.)

FOREIGN PATENT DOCUMENTS

| | | | |
|---|---|---|---|
| EP | 0818859 | 1/1998 | |
| EP | 0911621 | * 4/1999 | G01J/9/00 |
| JP | 60243604 | 12/1985 | |
| JP | 62242378 | 10/1987 | |
| JP | 02039582 | 2/1990 | |
| JP | 02153583 | 6/1990 | |
| JP | 05102589 | 4/1993 | |
| WO | 95/20144 | 7/1995 | |
| WO | 00/23764 | 4/2000 | |

OTHER PUBLICATIONS

WL500 Wavelength Locking Device, JDS Uniphase, Nov. 1999, 13 pages, MKT–DS–0153 Rev. B, JDS Uniphase Corporation, Canada.

M. Oberg et al., "74 nm Wavelength Tuning Range of an InGaAsP Vertical Grating Assisted Codirectional Coupler Laser with Rear Sampled Grating Reflector," *IEEE Photonics Technology Letters*, 5(7):735–738 (Jul. 1993).

P.J. Rigole et al., "114–nm Wavelength Tuning Range of a Vertical Grating Assisted Codirectional Coupler Laser with a Super Structure Grating Distributed Bragg Reflector," *IEEE Photonics Technology Letters*, 7(7):697–699 (Jul. 1995).

Derickson, "Static Fizaeu Interferometer Wavelength Meter", *Fiber Optic Test and Measurement*, Prentice–Hall, ISBN 0–13–534330–5, 163–165 (1998).

U.S. Appl. No. 09/871,230, filed May 31, 2001.
U.S. Appl. No. 10/014,218, filed Oct. 22, 2001.
U.S. Appl. No. 10/015,151, filed Dec. 11, 2001.
U.S. Appl. No. 10/014,278, filed Dec. 11, 2001.

*Primary Examiner*—Don Wong
*Assistant Examiner*—Hung Tran Vy
(74) *Attorney, Agent, or Firm*—Carlson, Caspers, Vandenburgh & Lindquist

(57) ABSTRACT

In an apparatus and method for locking the wavelength of a laser, a fringe-producing optical element is disposed directly in the in the output beam from the laser. The fringe-producing optical element produces a fringe pattern in a second light beam derived from the output beam. The fringe pattern is detected by a detector unit. Signals generated by the detector unit are used to generate a laser tuning control signal that tunes the laser to a desired operating wavelength.

34 Claims, 10 Drawing Sheets

U.S. PATENT DOCUMENTS

| | | | |
|---|---|---|---|
| 4,947,398 A | * | 8/1990 | Yasuda et al. .......... 372/29.021 |
| 5,121,371 A | * | 6/1992 | Farnsworth et al. ..... 369/44.26 |
| 5,130,998 A | * | 7/1992 | Wakata et al. ................ 372/32 |
| 5,167,444 A | | 12/1992 | Hall |
| 5,202,878 A | * | 4/1993 | Kanehira et al. ........ 369/13.29 |
| 5,323,409 A | | 6/1994 | Laskoskie et al. |
| 5,428,700 A | | 6/1995 | Hall |
| 5,515,468 A | | 5/1996 | DeAndrea et al. |
| 5,621,828 A | | 4/1997 | Baets et al. |
| 5,715,265 A | | 2/1998 | Epworth |
| 5,798,859 A | | 8/1998 | Colbourne et al. |
| 5,825,792 A | | 10/1998 | Villeneuve et al. |
| 5,828,689 A | | 10/1998 | Epworth |
| 5,917,596 A | * | 6/1999 | Jenkins et al. ............... 356/491 |
| 5,943,152 A | | 8/1999 | Mizrahi et al. |
| 5,956,356 A | | 9/1999 | Bergmann et al. |
| 5,963,686 A | | 10/1999 | Zheng et al. |
| 6,064,681 A | | 5/2000 | Ackerman |
| 6,067,181 A | | 5/2000 | Mizrahi |
| 6,094,271 A | | 7/2000 | Maeda |
| 6,111,681 A | | 8/2000 | Mizrahi et al. |
| 6,122,301 A | | 9/2000 | Tei et al. |
| 6,125,128 A | | 9/2000 | Mizrahi |
| 6,141,136 A | * | 10/2000 | Kalibjian ..................... 359/260 |
| 6,151,114 A | | 11/2000 | Russell ....................... 356/352 |
| 6,178,002 B1 | * | 1/2001 | Mueller-Wirts ............. 356/491 |
| 6,186,937 B1 | | 2/2001 | Ackerman et al. |
| 6,212,210 B1 | | 4/2001 | Serizawa |
| 6,233,263 B1 | | 5/2001 | Chang-Hasnain et al. |
| 6,243,403 B1 | | 6/2001 | Broutin et al. |
| 6,272,157 B1 | | 8/2001 | Broutin et al. |
| 6,323,987 B1 | | 11/2001 | Rinaudo et al. ............. 359/260 |
| 6,331,892 B1 | * | 12/2001 | Green ........................ 356/451 |
| 6,331,906 B1 | | 12/2001 | Sharma et al. |
| 6,366,592 B1 | | 4/2002 | Flanders |
| 6,433,921 B1 | * | 8/2002 | Wu et al. .................... 359/334 |
| 6,529,276 B1 | * | 3/2003 | Myrick ....................... 356/419 |
| 6,556,731 B2 | * | 4/2003 | Shekel et al. ................... 385/8 |
| 6,643,025 B2 | * | 11/2003 | Degertekin et al. ......... 356/505 |
| 2001/0007501 A1 | | 7/2001 | Frojdh |
| 2002/0181515 A1 | * | 12/2002 | Vilhemsson et al. .......... 372/20 |
| 2002/0181519 A1 | * | 12/2002 | Vilhemsson et al. .......... 372/32 |
| 2003/0072010 A1 | * | 4/2003 | Boye .......................... 356/520 |
| 2003/0107746 A1 | * | 6/2003 | Hedin et al. ................ 356/519 |
| 2003/0108072 A1 | * | 6/2003 | Hedin ......................... 372/32 |

\* cited by examiner

METHOD AND APPARATUS FOR LASER WAVELENGTH STABILIZATION

FIELD OF THE INVENTION

The present invention is directed generally to lasers and more particularly to an apparatus for monitoring and stabilizing the operating wavelength of a laser.

BACKGROUND

The widespread introduction of wavelength division multiplexed (WDM) and dense wavelength division multiplexed (DWDM) optical transmission systems relies on the availability of optical transmitters operating at precisely controlled wavelengths. Such transmitters typically use wavelength selected laser diodes as the optical source. Typical DWDM systems operate with many wavelengths, uniformly spaced by frequency, operating in the so-called C-band and/or S-band or L-band, windows of gain provided by the erbium-doped fiber amplifier. For example, in accordance with the optical communications standards set by the International Telecommunications Union (ITU), a DWDM system may operate with 80 channels of different wavelengths uniformly spaced by a channel spacing of 50 GHz. It is anticipated that future systems will operate with greater numbers of channels and with smaller interchannel spacings.

It is also desirable that DWDM systems operate with lasers that are locked to the particular channel frequency, without long-term drift. If the wavelength of the laser drifts, the system may suffer unacceptable crosstalk in adjacent channels. A typical requirement is that the frequency of the laser output does not drift by more than 3 GHz over a span of twenty years. A laser diode will naturally drift by an amount considerably greater than 3 GHz over this time period, the actual amount of the drift being dependent on specific aging characteristics of the laser.

This time-dependent frequency drift can be minimized, if not avoided altogether, by actively controlling the laser wavelength. Active control may include deliberately changing an operating characteristic of the device that affects the output wavelength, such as temperature or current, to compensate for the natural frequency drift. This requires a fixed, known frequency reference for comparison of the emission wavelength from the laser. It is often desirable for network management purposes that each laser be locked locally to its own reference, preferably within the laser diode package. It is also desirable in some circumstances that a single, standard reference assembly can be used with any one of a multitude of fixed frequencies, or with a tunable laser capable of operation at any such wavelength. This enables a widely tunable laser to be used at any of the channel frequencies, and avoids the requirement that the laser be selected to operate within only a small fraction of the channels.

Various wavelength locking solutions have been proposed, including the use of crystal gratings and fiber Bragg gratings, interference filters and etalons. Crystal and fiber Bragg gratings are optimized for operation at one wavelength and do not fit easily into a standard laser diode package. Interference filters can fit inside a laser package, but are typically also optimized for only one wavelength.

Fabry-Perot etalons have been the subject of significant development in wavelength locking schemes. These devices demonstrate a transmission curve that has periodical maxima when plotted against light frequency. This periodical transmission curve needs to be tuned to match the required ITU-grid frequency spacing, which is done either by tilting the etalon or changing its temperature. However, tuning the etalon is a sensitive and complicated process which requires active alignment or precise temperature control. In addition the tuning process becomes more sensitive as the number of ITU channels increases or the interchannel spacing decreases.

Therefore, there is a need for an approach to stabilizing the wavelength of a laser output that is low cost, easily adjustable in production and is sufficiently compact to fit into a standard laser package. Furthermore, since the wavelength locker may be used to stabilize the output from a backup laser diode that substitutes for a laser that has failed, the wavelength locker should be able to operate at any wavelength over the DWDM band.

SUMMARY OF THE INVENTION

Generally, the present invention relates to an apparatus and method for locking the wavelength of a laser that uses a fringe-producing optical element in the output beam of the laser. The fringe producing optical element produces a fringe pattern in a second light beam derived from the output beam. The fringe pattern is detected using a detector unit. Signals generated by the detector unit are used to generate a laser tuning control signal that tunes the laser to a desired operating wavelength.

One embodiment of the invention is directed to a laser system that includes a laser producing a beam of output light and a detector unit. A fringe-producing optical element is disposed in the beam of output light to direct a portion of the beam of output light to the detector unit as a second light beam. The fringe-producing optical element causes an interference pattern in the second light beam.

Another embodiment of the invention is directed to a optical communications system that includes an optical communications transmitter unit having one or more laser units, an optical communications receiver unit, and an optical fiber communications link coupled to transfer optical communications signals from the optical communications transmitter unit to the optical communications receiver unit. At least one of the one or more laser units produces a laser output beam and has a wavelength stabilizing unit. The wavelength stabilizing unit includes a detector unit and a fringe-producing optical element disposed in the laser output beam to direct a portion of the laser output beam to the detector unit as a second light beam. The fringe-producing optical element causes an interference pattern in the second light beam. A control unit is coupled to receive detection signals from the detector unit and generates a laser frequency control signal for controlling wavelength of the at least one of the one or more laser units, Another embodiment of the invention is directed to a method of stabilizing an operating frequency of an output light beam produced by a laser. The method includes deflecting a portion of the output light beam as a second light beam using a fringe-producing optical element, the fringe-producing optical element causing an interference fringe pattern in the second light beam. Portions of the interference fringe pattern are detected using a detector unit and detector signals are produced in response to the detected portions of the interference fringe pattern. A frequency control signal is generated in response to the detector signals and the laser is tuned in response to the frequency control signal so that the operating frequency of the output light beam is substantially at a desired value.

Another embodiment of the invention is directed to a method of stabilizing an operating frequency of an output light beam produced by a laser. The method includes deflecting a portion of the output light beam as a second light beam using a fringe-producing optical element. The fringe-producing optical element causes an interference fringe pattern in the second light beam. The operating frequency of the output light beam is stabilized using the interference pattern.

Another embodiment of the invention is directed to a system for stabilizing an operating frequency of an output light beam produced by a laser. The system includes deflecting means for deflecting a portion of the output light beam as a second light beam and for producing an interference fringe pattern in the second light beam. The system also includes means for stabilizing the operating frequency of the output light beam using the interference fringe pattern.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
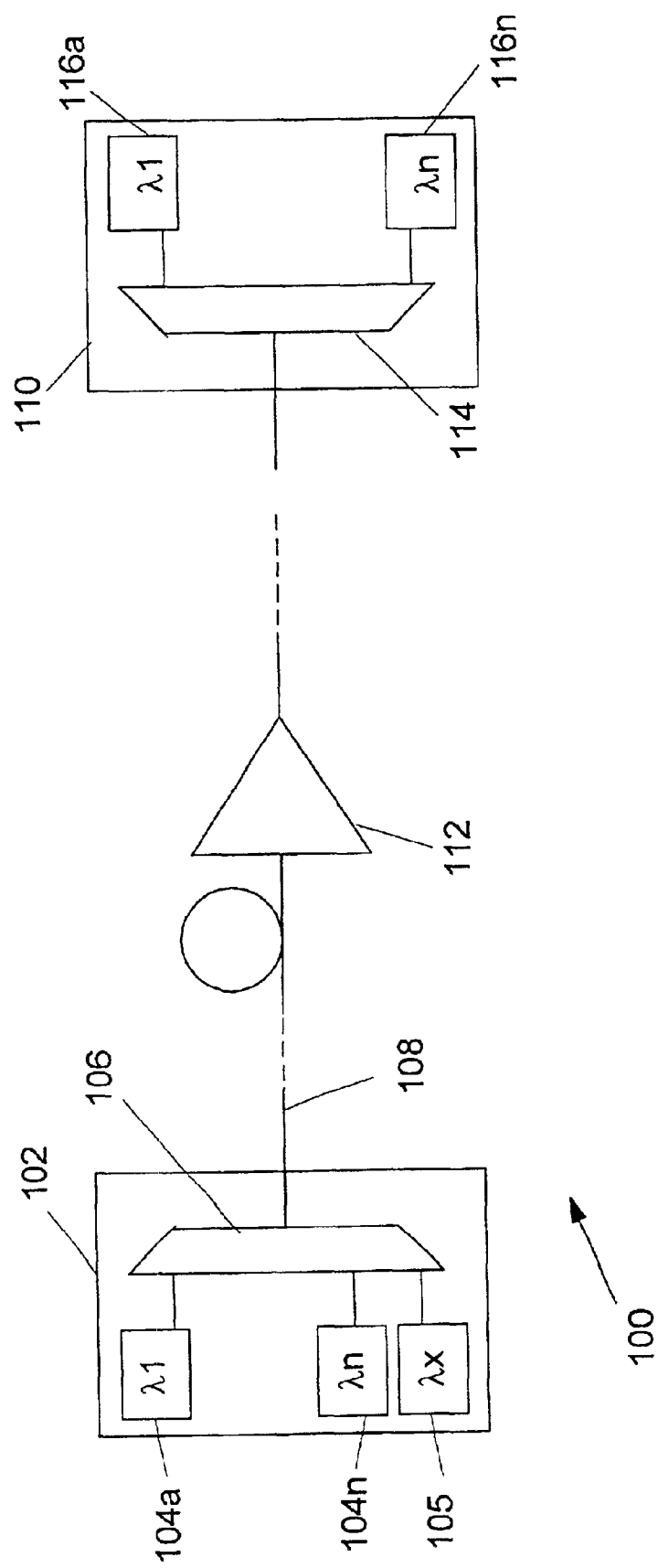
FIG. 1 schematically illustrates an optical communications system that includes a laser whose wavelength is stabilized according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The invention is related to another invention entitled "METHOD FOR CONTINUOUS WAVELENGTH LOCKING", filed on even date herewith by G. Hedin, having a U.S. patent application Ser. No. 10/015,151, and "ROBUST WAVELENGTH LOCKER FOR CONTROL OF LASER WAVELENGTH" filed on even date herewith by G. Hedin and J. Tegin, having a U.S. patent application Ser. No. 10/014,278, both of which are incorporated herein by reference.

The invention provides a compact wavelength monitoring assembly for use in conjunction with tunable laser sources. The wavelength monitoring assembly is used for stabilization of the emission wavelength and for locking the wavelength to an electrical reference signal. The compact optical configuration of the assembly makes the device particularly well suited for incorporation inside standard packages that are used in telecommunications applications.

According to one embodiment of the invention, a fringe-producing optical element is illuminated and produces an interference fringe pattern. The fringe-producing optical element may be an etalon, typically a solid etalon, that has one surface non-parallel with respect to the other surface. The non-parallel surface may be curved, stepped or flat. As the laser frequency, f, changes, the interference fringe pattern moves and is monitored by a set of detectors having a spatial distribution chosen to match the interference pattern, thereby sampling the interference pattern at fixed positions with known spatial phase differences. From the detector signals, it is possible to determine the spatial phase $\phi$ (fringe position) of the interference pattern. The phase signal changes by $2\pi$ for a laser frequency shift equal to one free spectral range (FSR). At least three detector signals are used to uniquely identify the phase of an interference pattern.

This approach offers advantages over prior approaches to wavelength locking. For example, the output power from the laser may be inferred from the detected signals, and so there is no need for a separate power monitor. Furthermore, the frequency locking system based on the use of at least three signals is robust, and permits locking to any desired frequency. Since the wavelength and the frequency of light are related, it will be appreciated that these terms, in some instances, may be used interchangeably.

Another advantage is that no etalon tuning is needed since the absolute value of FSR only affects the derivative $d\phi/df$ or, equivalently, $d\phi/d\lambda$. In other words, absolute value of FSR affects the speed of the fringe pattern motion with changing frequency. Passive alignment of the etalon is possible due to the weak dependence on FSR. Another advantage is that the locker is able to lock frequencies on an irregular frequency grid, since no matching of the etalon transmission curve to the frequency grid is needed.

A laser stabilized using the present invention may be employed in a DWDM communications system 100, schematically illustrated in FIG. 1. The system 100 includes a WDM transmitter unit 102 that includes a number of lasers 104a–104n operating at different wavelengths, $\lambda 1$–$\lambda n$. Any of the lasers 104a–104n may be a laser whose wavelength is stabilized according the present invention. In addition, one or more spare lasers 105 may operate as a substitute if any of the lasers 104a–104n fail. The lasers 104a–104n and 105 may each include modulators for modulating information onto the respective output light beams. The outputs from the lasers 104a–104n, 105 may be combined in a DWDM combiner arrangement 106 and launched as a DWDM signal into an optical fiber communications link 108 that is coupled to a DWDM receiver 110. The fiber link 108 may include one or more fiber amplifier stages 112 to amplify the DWDM signal as it propagates to the DWDM receiver 110. Other elements, such as isolators, switches, add/drop multiplexers and the like may also be disposed along the fiber link 108. The DWDM receiver 110 demultiplexes the received DWDM signal in a demultiplexer 114 and directs signals at different wavelengths λ1–λn to respective channel detectors 116a–116n.

Figure 2:
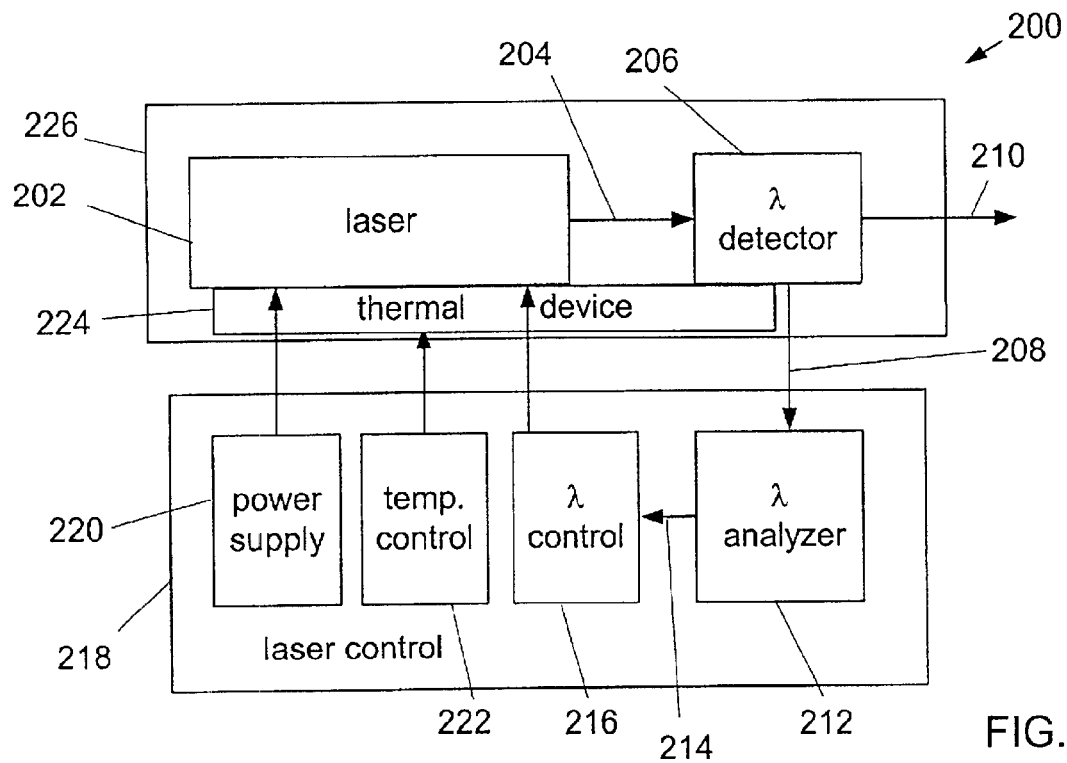
FIG. 2 is a block schematic diagram illustrating elements of a frequency stabilized laser.

A block schematic diagram showing various elements of a frequency stabilized laser unit 200 is illustrated in FIG. 2. A laser 202 generates an output light beam 204 that is directed to a wavelength detector unit 206, which generates an output signal 208 determined by the wavelength of the light in the light beam 204.

The laser may be any suitable type of semiconductor laser that produces a tunable output. Monolithically tunable lasers are often used in optical communications applications, such as distributed Bragg reflector (DBR) lasers, grating coupled, sampled Bragg reflector (GCSR) lasers, for example as described in "74 nm Wavelength Tuning Range of an InGaAsP Vertical Grating Assisted Codirectional Coupler Laser with Rear Sampled Grating Reflector" by M. Oberg et al., IEEE Photonics Technology Letters, Vol. 5, No. 7, pp. 735–738, July 1993, incorporated herein by reference, and in U.S. Pat. No. 5,621,828, also incorporated herein by reference, and vernier, dual DBR lasers, for example as described in U.S. Pat. No. 4,896,325.

A residual output beam 210, passing from the wavelength detector unit 206, may carry optical output power not used in the determination of the wavelength. The residual output beam 210 may be used as the useful optical output from the laser 202. Where the output light beam 204 carries the main optical output from the laser 202, the wavelength detector unit 206 advantageously uses only a small fraction, for example a few percent, of the output light beam 204, in order to increase the power in the residual output beam 210.

A wavelength analyzer unit 212 receives and analyzes the output signal 208 from the wavelength detector unit 206 to determine the wavelength of the light beam 204. The analyzer 212 typically generates an error signal 214 that is directed to a wavelength controller. The size of the error signal typically indicates the amount by which the measured wavelength of the laser deviates from a desired value. The error signal 214 is directed to a tuning controller 216 that is connected to the laser 202 and controls the operating wavelength of the laser 202.

The wavelength tuning controller 216 may be incorporated with a laser controller 218 that includes the power supply 220 for providing power to the laser 202 and a temperature controller 222 that controls the temperature of the laser 202. The laser 202 may be coupled, for example, to a thermoelectric device 224 or other type of device for adjusting temperature.

The laser 202 and wavelength detector unit 206 may be enclosed within a housing 226 to prevent environmental effects from affecting the operation of the laser 202 and the wavelength detector unit 206. The device 224 for adjusting operating temperature may also be located within the housing 226.

Figure 3:
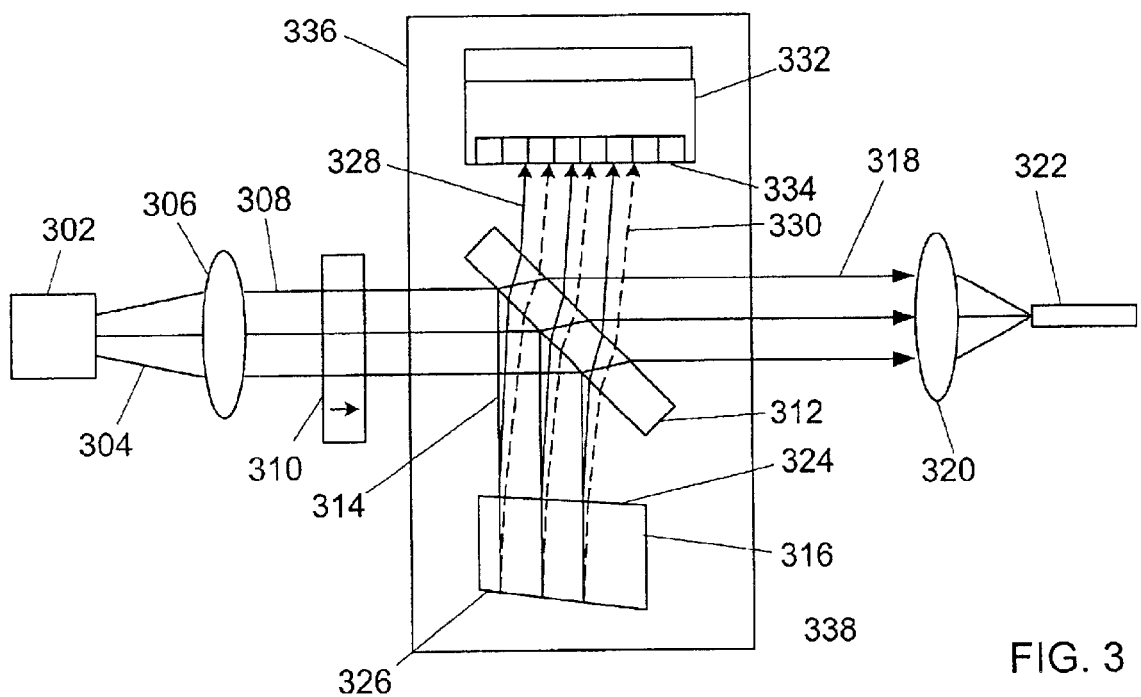
FIG. 3 schematically illustrates one approach to generating an optical signal used for wavelength locking, according to the present invention.

One particular embodiment of a wavelength stabilized detector unit is illustrated in FIG. 3. The laser 302 generates an output light beam 304 whose divergence is reduced by a focusing unit 306. The focusing unit may include one or more lenses. The light beam 308 passing out of the focusing unit 306 may be approximately collimated, or may be convergent or divergent. For purposes of clarity, it is assumed in the following description that the light beam 308 is collimated. It will be appreciated, however, that the present invention also operates convergent and divergent light.

The light beam 308 may pass through an optical isolator 310, which permits light to pass in the forward direction, but which prevents light passing in the backwards direction towards the laser 302. This prevents reflected light from re-entering the cavity of the laser 302 and adversely affecting the stability of the light 304 output from the laser. After the light 308 has passed through the isolator 310, a beamsplitter 312 splits a fraction 314 of the light 308 as a probe beam. The beamsplitter 312 may be, for example, a flat piece of glass with one side antireflection coated, where the probe beam 314 is split off by reflection from the uncoated surface. The beamsplitter 312 may also be a beamsplitter cube or any other suitable form of optical element that samples the light 308 from the laser 302.

The light transmitted through the beamsplitter 312 forms the residual beam 318, which may be directed to a focusing unit 320, typically one or more lenses, for coupling into the output fiber 322. Typically, the optical power coupled into the output fiber 322 constitutes the useful output light from the laser 302 and may be used to form an optical communications signal. The output fiber 322 may lead first to a modulator for imposing information on the light propagating along the fiber 322. Typically, the optical power in the probe beam 314 is around a few percent of the power in the residual beam 318.

The probe beam 314 is directed to a fringe-producing optical element 316, such as a non-parallel etalon (NPE). Some types of fringe-producing optical elements are discussed further in U.S. patent application Ser. No. 09/871, 230, incorporated herein by reference. In the illustrated embodiment, the fringe-producing optical element 316 is a NPE. When illuminated with a beam of light, a fringe-producing optical element produces a second beam of light that includes an interference pattern, having interference fringes. The second beam of light may be reflected from the fringe-producing optical element or may be transmitted from the fringe-producing element. Typically, the second beam is formed by two interfering beam components arising from two different surfaces of the fringe-producing element.

The probe beam 314 propagates to the NPE 316, which operates as a spatial wavelength selective filter. The NPE 316 is formed from material that transmits light at the output wavelength of the laser 302, for example glass or plastic. An NPE has surfaces that contain portions that are non-parallel, and may be wedged or may include at least one non-planar surface. A non-planar surface may assume any type of shape, including spherical, aspherical, toroidal, cylindrical, or stepped shapes. If the etalon includes a non-planar surface, it may be referred to as a non-planar etalon. A NPE having a stepped surface may be, for example, a binary optic etalon or a Fresnel etalon, as described below. A NPE having a stepped surface may also have a wedged or curved profile.

In the illustrated embodiment, the NPE 316 has first and second faces 324 and 326 that are flat, but not parallel to each other, and so the NPE 316 is wedged. The reflectivity of the first face 324 is R1 and the reflectivity of the second face 326 is R2. The magnitudes of the surface reflectivities, R1 and R2, may be equal, although they need not be equal. For example, if the NPE 316 is formed from glass having uncoated surfaces 324 and 326, then the reflectivities R1 and R2 are determined by the difference in refractive index between the material of the NPE 316 and the medium in which the NPE 316 is immersed. If the NPE 316 is formed from glass, having a refractive index of around 1.5, and is immersed in air, then the reflectivity of each surface 324 and 326 is around 4%, when the angle of incidence on the faces 324 and 326 is close to normal. It will be appreciated that the surfaces 324 and 326 may also be provided with coatings having specific reflective values in the range from greater than 0% to almost 100%. In the present invention, the reflectivities R1 and R2 may lie in the range 1%–50%, and more preferably in the range 10%–25%. The values of R1 and R2, however, need not be restricted to these ranges.

The probe beam 314 is partially reflected at the first surface 324 and partially transmitted into the material of the NPE 316. This partially transmitted beam propagates towards the second surface 326 where it is again partially transmitted and partially reflected. The light undergoes a series of internal reflections within the NPE 112. The total optical power reflected from the NPE 316 towards the beamsplitter 312 may be determined from coherent addition of all partially reflected beams. Where the reflectivity is low, however, for example 10% or lower, then the light reflected by the NPE 316 is primarily the light that was reflected only once, by either the first or second surface 324 or 326. In the illustrated embodiment, the light reflected by the first surface 324 is labeled beam 328 (solid lines) and the light reflected by the second surface 326 is labeled as 330 (dotted lines), although it is understood that a component of the reflected signal corresponds to light that was reflected within the NPE 316 multiple times.

The beams 328 and 330 pass through the beamsplitter 312 and are incident on a detector unit 332 that includes at least three detector elements 334, also referred to as detector pixels. The pixels 334 may be arranged in an array. Furthermore, the shape of the pixels 334 may be adapted so as to increase the overlap with the interference fringes of the interference pattern formed in the light by the NPE 316. For example, where the NPE 316 is wedged with flat surfaces, the interference pattern includes parallel fringes and the pixels 334 may be rectangular, and elongated in the direction perpendicular to the fringe separation. Where the NPE 316 has a curved surface, the resulting interference fringes may be curved and the pixels may be curved to match the curves of the interference fringes.

The detector unit 332 may be mounted on a detector carrier 336, which provides mechanical support for the detector unit 332 which may also provide electrical contact between the detector unit 332 and the control unit (not shown). The carrier 336 may be formed from an electrically insulating material, such as alumina or the like, and may be provided with bond pads for forming electrical contacts.

The detector carrier 336, beamsplitter 312 and NPE 316 may all be mounted on a mounting plate 338 that provides a thermal, electrical and/or mechanical interface between the NPE 316, detector carrier 332 and beamsplitter 312, and the rest of the laser housing 226. The design of the mounting plate 338 may provide solder and bond pads and may also include electrical circuit lines for electrical connections. The mounting plate 338 may be formed from an electrically insulating material, although it is also advantageous that the carrier be a good thermal conductor. Accordingly, the mounting plate may be formed from alumina, aluminum nitride, or some other ceramic having good thermal conductive properties.

Interference between light reflected from the first and second surfaces 324 and 326 results in spatial modulation of the light incident on the detector unit 332. The spatial modulation is typically periodic, although depending on the curvature of the surfaces 324 and 326 of the NPE 316, the period may vary across the detector unit 332. In the illustrated example of a wedged reflector, having flat surfaces 324 and 326, the period of the interference pattern is constant across the detector unit 332.

The detector unit 332 has at least three pixels 334 that detect different parts of the spatially modulated interference pattern. The three, or more, pixels 334 are positioned so as to detect different parts of the interference pattern that correspond to different spatial phase. The NPE 316 and detector unit 332 are advantageously designed to match each other so that the spacing of the pixels 334 is such that the pixels 334 are positioned to detect evenly spaced portions of a period of the interference pattern. For example, if the detector unit 332 uses three pixels, then uniform spacing between pixels, which permits simultaneous power monitoring, corresponds to a phase difference of the periodic interference pattern of about $2\pi/3$. More generally, where the detector unit 332 employs n pixels 334, then the spacing between pixels 334 corresponds to $2\pi/n$. It will be appreciated that adjacent pixels 334 may be have different spacings, for example may also be spaced apart by a distance corresponding to $m\pi+2k\pi/n$, where k and m are integers.

The diffraction and pointing sensitivity is much reduced since only linear spatial modulation in one direction is measured. The degradation properties are improved since all pixels 334 are manufactured on the same chip. The manufacturing and assembling of the wavelocker system requires only alignment of the etalon by rotation about one axis, and alignment of the detectors by translating along another axis, in order to correctly map the pattern on to the detectors.

Figure 4:
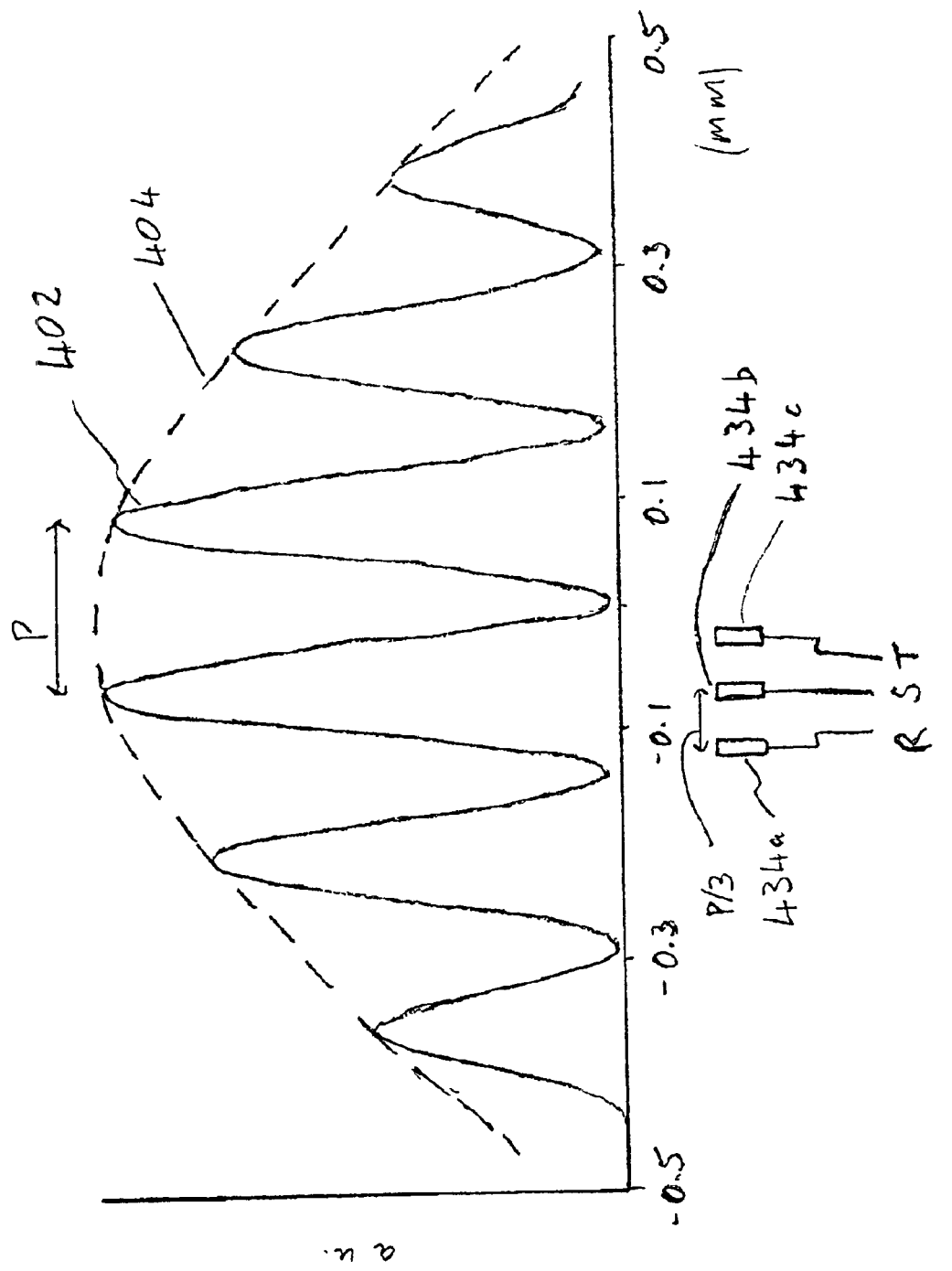
FIG. 4 schematically illustrates the spatial pattern of light generated by a non-planar etalon and an embodiment of a detector unit used for detecting the spatial pattern of light according to the present invention.

In an example illustrated in FIG. 4, an interference pattern 402 is shown as light intensity (in arbitrary units) as a function of spatial position, measured in mm. The period of the interference pattern 402 is P and, in this example where three pixels 434a, 434b and 434c are used, the spacing between the pixels 434a, 434b and 434c is P/3. The interference pattern 402 was obtained from simulations of a NPE formed from BK7 glass, having a refractive index of 1.51 at a design wavelength of 1.55 $\mu$m. The assumed thickness of the NPE was 2 mm and the wedge angle was 0.2°, resulting in a fringe spacing in the interference pattern of about 150 $\mu$m. The surface reflectivity was in the range 10%–20%. The spacing between pixels 334 of the detector unit 332 is 50 $\mu$m. The pixels may be 500 $\mu$m high and 25 $\mu$m wide.

The choice of reflection coefficient of the NPE is a compromise between fringe shape, modulation depth, optical power and ghost fringes. Sinusoidal patterns are often preferred for various feedback detection schemes, and are obtained for reflection coefficients less than about 10%. Near-sinusodial fringe patterns are obtained for reflection coefficients in the range of about 10%–25%, and when the reflection coefficient is greater than about 25%, the fringe pattern assumes a periodical Lorentzian shape, characterized by sharp peaks and broad valleys.

The modulation depth MD, is given by the expression MD=(Imax−Imin)/(Imax+Imin). The MD of a reflected interference pattern is close to 100% where the reflection coefficient is less than about 25%. On the other hand, the modulation depth of an interference pattern transmitted through the NPE increases, at least for small values of R, as 2×R. Therefore, an uncoated NPE having a surface reflection of 4% manifests a MD of 8%. Thus, the fraction of optical power in the reflected pattern is about 2×R, and about 1−(2×R) in the transmitted pattern. Therefore, the ratio of transmitted to reflected power is about 11 for an uncoated NPE having a surface reflection of about 4%.

Ghost fringes may occur for higher values of reflection, typically about 25% and more, due to multiple reflections in the NPE. These ghost fringes at best create a background that reduces the MD, and at worst cause higher spatial frequencies in the interference pattern. Therefore, when detecting a reflected interference pattern, the surface reflectivity of the NPE is advantageously low to increase the MD and to make the fringe pattern more closely sinusoidal. It will be understood that the surface reflectivity may be have a lower boundary set by the minimum acceptable level of optical power at the detector chip. For a configuration such as that as illustrated in FIG. 3, an optimal value for the surface reflectivity may lie in the range 5%–15%. Where the fringe pattern transmitted through the NPE is detected, the value of R should be high to increase the MD, but not so high as to cause higher order distortions of the fringe pattern. A typical value of reflectivity for an NPE operating in transmission is around 30%.

The detector unit 332 may be positioned behind the NPE 316 to detect the interference pattern on the light transmitted through the NPE 316. As a result of using reflectivities less than about 25% on the surfaces 324 and 326, however, the interference pattern of light transmitted through the NPE 316 has a relatively low modulation depth. In comparison, the modulation depth of the interference pattern reflected from the NPE 316 is relatively high. Therefore, use of the interference pattern reflected from the NPE 316 provides advantages in signal to noise.

The frequency, f, of the light output from the laser 302 may be presented in terms of the free spectral range (FSR) of the NPE 316 as f=k×FSR+f', where k is an integer value. The value of the FSR may be obtained from the expression FSR=c/(2$n_0$I), where $n_0$ is the refractive index of the NPE 316 and I is the thickness of the NPE 316. Therefore, the phase of the interference pattern 402 relative to the pixels 434a, 434b and 434c is proportional to f'. The phase of the interference pattern 402 is, therefore, a direct measurement of the output laser frequency, at least over a frequency range equal to the FSR.

The output signal from the first pixel 434a may be termed R, the output signal from the second pixel 434b may be termed S and the output from the third pixel 434c may be termed T. Where the number of pixels 434 is three or more, the sum of the optical signals on the pixels 434 is a direct measurement of the average irradiance on to the detector chip. Consequently, so long as there is adequate calibration, for example to extract variations in signal level due to the intensity envelope 404, the sum of the signals from the pixels (R+S+T) is proportional to the total laser power.

Figure 5:
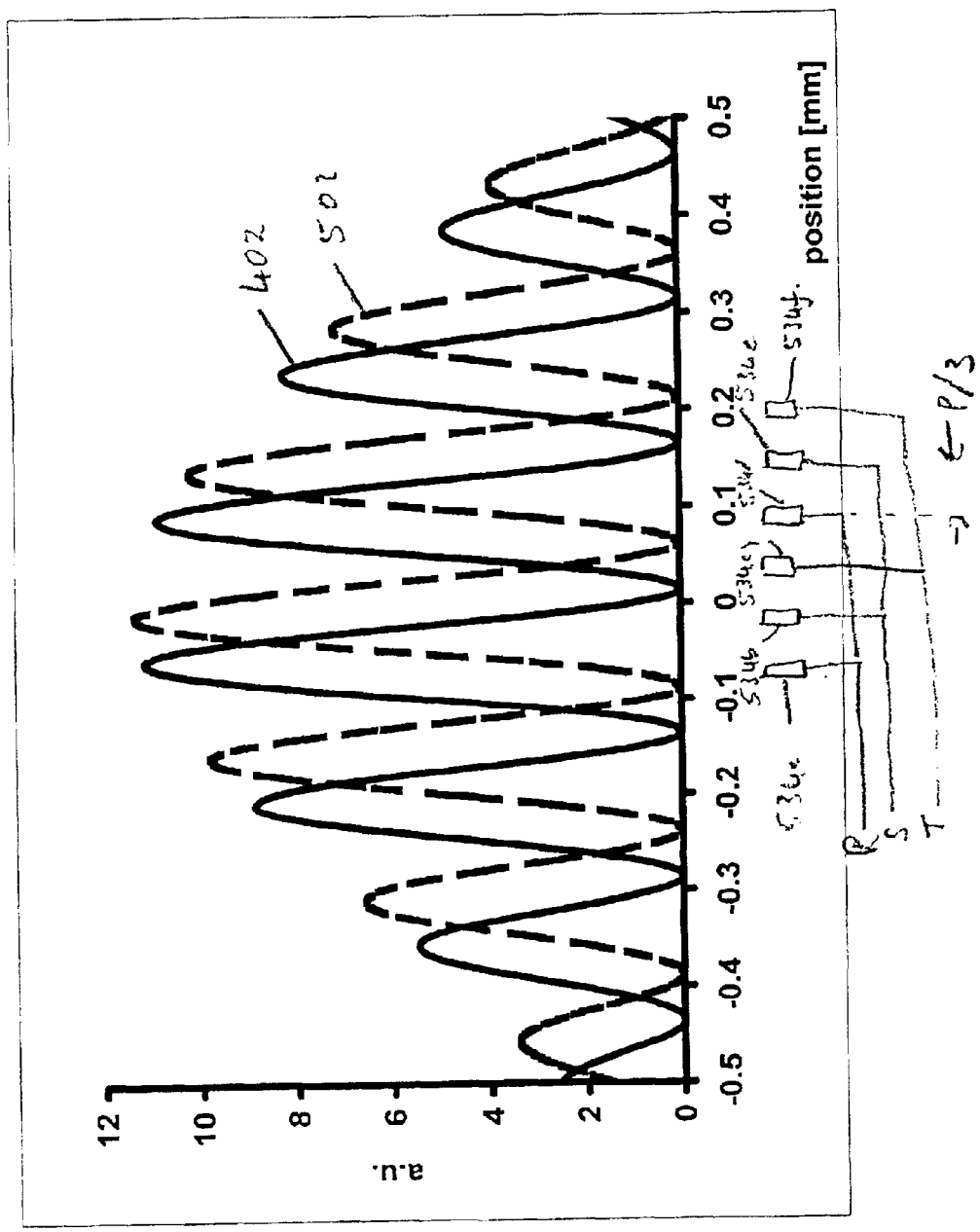
FIG. 5 schematically illustrates the spatial patterns of light generated by a non-planar etalon at different wavelengths and another embodiment of a detector unit used for detecting the spatial pattern of light according to the present invention.

The effect of changing the wavelength is described with reference to FIG. 5, which shows the interference pattern 502 formed when the laser output is at a first frequency, and a second interference pattern 504 formed when the laser output is changed to a second frequency. The fringe pattern is seen to move across the detector unit 332 when the laser frequency changes. This movement is detected by the detector unit 332, since the signals produced by the different pixels 434 change.

Furthermore, in this embodiment, the pixels 534a–534f cover a span of two periods of the interference patterns 402 and 502. The outputs from two pixels spaced apart by the period may be combined. For example, the outputs from pixels 534a and 534d may be combined to form signal R, the outputs from pixels 534b and 534e may be combined to form signal S and the outputs from pixels 534c and 534f may be combined to form signal T. The inter-pixel spacing for the pixels 534a–534f is P/3. An advantage to using more than one pixel to detect a particular phase portion of the interference pattern 502 and 504 is that the signal to noise ratio may be increased.

Figure 6:
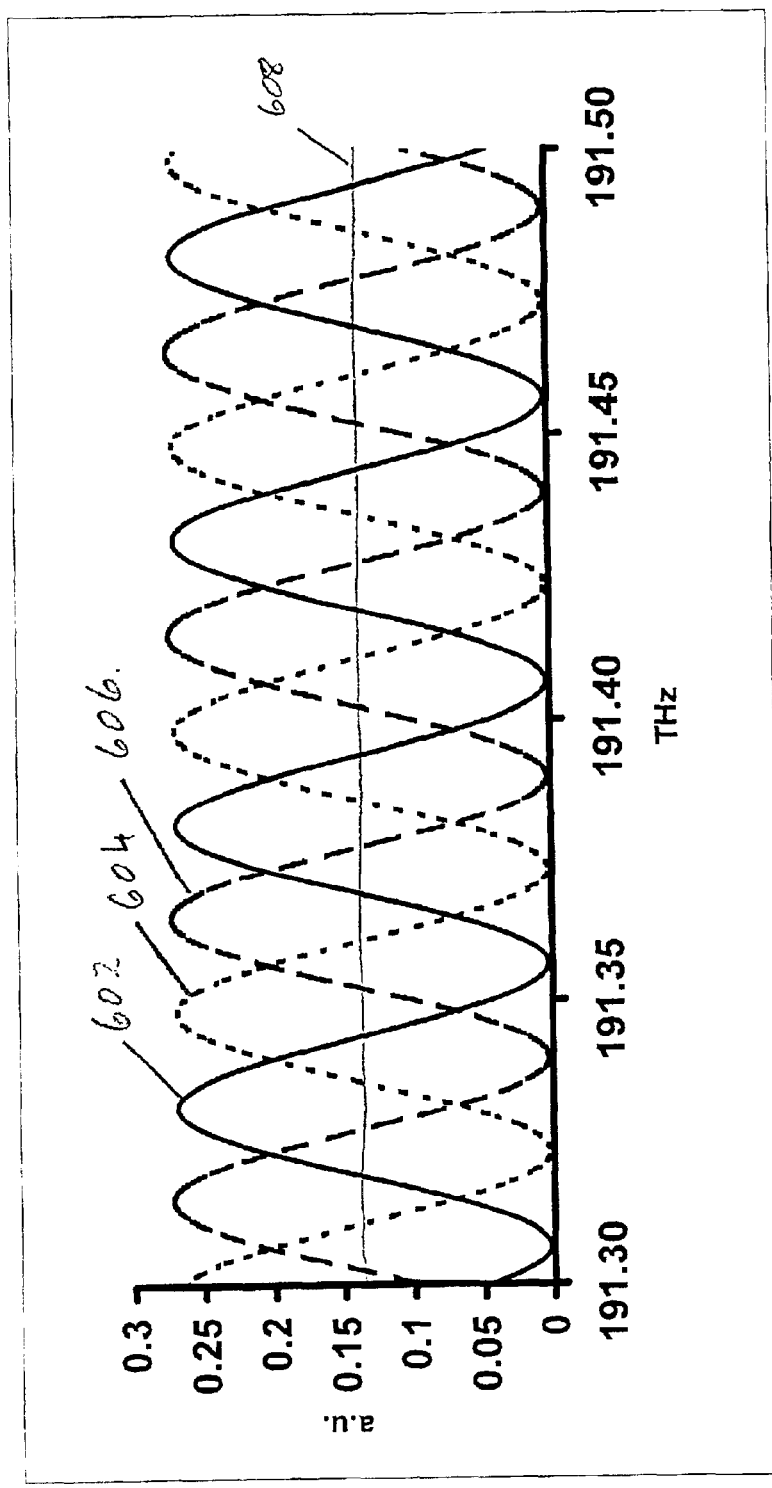
FIG. 6 shows a graph illustrating compound detector signals as function of frequency.

Another illustration of the effect of changing the wavelength of the light being detected by the detector unit 332 is presented in FIG. 6, which shows the values of R, S, and T as functions of the frequency of the light incident on the NPE 316. The values of R (curve 602), S (curve 604), and T (curve 606) all vary periodically with increasing frequency of the incident light. Furthermore, the signals R, S, and T are equally spaced from each other.

One approach to describing the signals R, S, and T is:

$R=I_0(1+\cos(\phi+\alpha))$ $S=I_0(1+\cos(\phi))$, and $T=I_0(1+\cos(\phi-\alpha))$ where $\phi$ is the phase of the interference fringe, $\alpha$ is the the phase difference between adjacent pixels and $I_0$ is the average light irradiance. For three-pixel detection, where the detectors are spaced evenly over a period of the interference pattern, $\alpha$ has a value equal to $2\pi/3$ (120°). The value of $\phi$ depends on the free spectral range (FSR) of the etalon and the frequency, f, of the incoming light through the expression: $\phi=4\pi f$ mod (FSR), where f mod (FSR) is the remainder after highest possible intergral number of FSRs is substracted from the frequency. For example, if the frequency is given by f=191,045 GHz, and the FSR is 100 GHz, then f mod (FSR) is 45 GHz.

The following signals may be calculated from the measured values of R, S, and T. First, the value I is given by:

$$I=(R+S+T)/3 \tag{1}$$

where I is independent of $\phi$ and is equal to $I_0$. Therefore, I is proportional to the laser power incident on the detector unit 332 and, consequently, may be proportional to the output power from the laser. The average signal 608 in FIG. 6 represents I.

Another useful signal is $\cos(\phi)$ where:

$$\cos(\phi)=(S-I)/I \tag{2}$$

and another useful signal is:

$$\sin(\phi)=(T-R)/(I\sqrt{3}). \tag{3}$$

Therefore, one value of $\phi$ may be calculated as:

$$\phi=\tan^{-1}[\sin(\phi)/\cos(\phi)] \tag{4}$$

Figure 7:
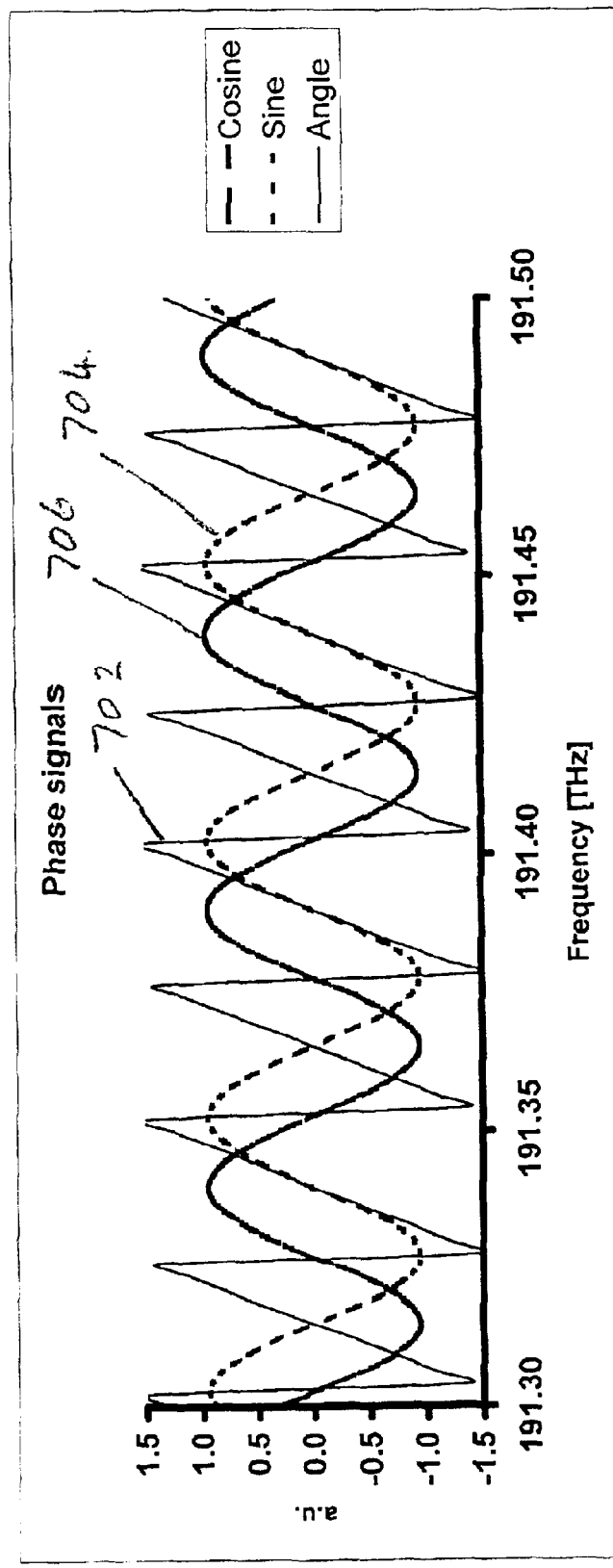
FIG. 7 shows a graph illustrating phase signals obtained from the compound signals shown in FIG. 6.

Examples of curves showing the relative values of the phase signals $\phi$ (curve 702), $\sin(\phi)$ (curve 704) and $\cos(\phi)$ (curve 706) for different frequencies of incident laser light are presented in FIG. 7, for the same example of NPE discussed previously.

To lock the laser light to a certain frequency, the laser is first tuned to the locking value, $f_0$, in other words that value to which it is desired to lock the laser, and the detector signals, R, S, and T, for that frequency are stored as $R_0$, $S_0$ and $T_0$.

These values of $R_0$, $S_0$ and $T_0$ are then used in expressions (2), (3) and (4) to calculate reference phase signals, $\sin(\phi_0)$, $\cos(\phi_0)$ and $\phi_0$. The reference phase signals may be used to calculate a feed-back signal along with the phase signals, $\sin(\phi)$, $\cos(\phi)$ and $\phi$, from the measured signals.

Transformed signals may be calculated by forming a transformed phase, $\phi'=\phi-\phi_0$. Therefore, transform equations are as follows:

$$\cos(\phi')=\cos(\phi_0)\cos(\phi)+\sin(\phi_0)\sin(\phi) \quad (6)$$

$$\sin(\phi')=-\sin(\phi_0)\cos(\phi)+\cos(\phi_0)\sin(\phi) \quad (7)$$

$$\phi'=\tan^{-1}(\sin(\phi')/\cos(\phi')) \quad (8)$$

Figure 8:
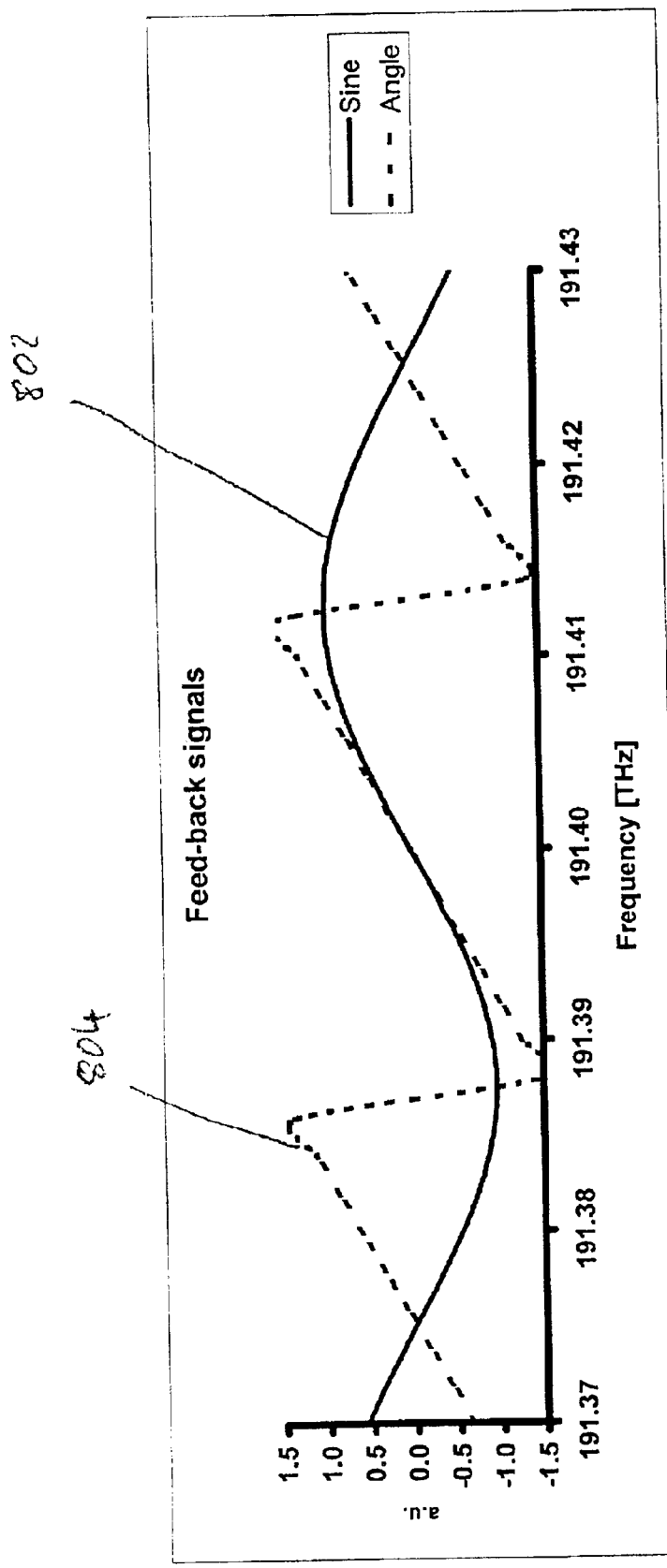
FIG. 8 shows a graph illustrating feedback signals used for stabilizing frequency of the laser.

Two types of feed-back signals, used as error signals 214, may be formed from these expressions. The first feedback signal is $\sin(\phi')$, expression (7). This has a capture range of ±FSR/2, and has a nonlinear response. This is termed sine feedback. The other feedback signal is $\phi'$, as provided in expression (8). This feedback signal has a capture range of ±FSR/4 and has a linear response. This is termed phase feedback. Phase feedback provides the advantage over sine feedback that the response is linear, however, more processing is required to calculate $\phi'$ than is required to calculate $\sin(\phi')$. The values of $\sin(\phi')$, curve 802, and $\phi'$, curve 804, are shown in FIG. 8, plotted against frequency of the light being locked. The signal $\cos(\phi')$ may also be used as a feedback signal.

It will be appreciated that a similar analysis may be performed using four or more detector elements spaced to sample portions of the interference pattern corresponding to different values of phase over a period. Such analysis yields feedback equations corresponding to expressions (6)–(8).

One of the advantages with this approach to locking the frequency of the laser include is that any frequency may be locked on to with the same capture range and response slope, and that the absolute thickness and tilt of the etalon is a weak variable that only determines the slope of the feed-back signal at the locking point and the absolute capture range. Another advantage is that the intensity may be inferred from the signals received by the detector unit 332 that is used to measure the wavelength, and no additional power monitor is required.

Where the NPE has at least one curved surface, the spacing between the maxima of the interference pattern may not be constant. In such a case, the spacings between adjacent pixels in the detector unit need not be constant, but may be selected to suit the nonlinearity of the interference pattern. For interference patterns where the nonlinearity is relatively small, the pixels may still be spaced apart by a uniform inter-pixel spacing: the feedback scheme is robust and does not require exact inter-pixel spacing for operation. For example, in a three pixel detector scheme, adequate feedback may still be provided where the spacing between pixels is $2\pi/3\pm\pi/6$, even where the NPE is a wedged etalon. The feedback technique may also operate outside this range, but with decreased effectiveness.

Figure 9:
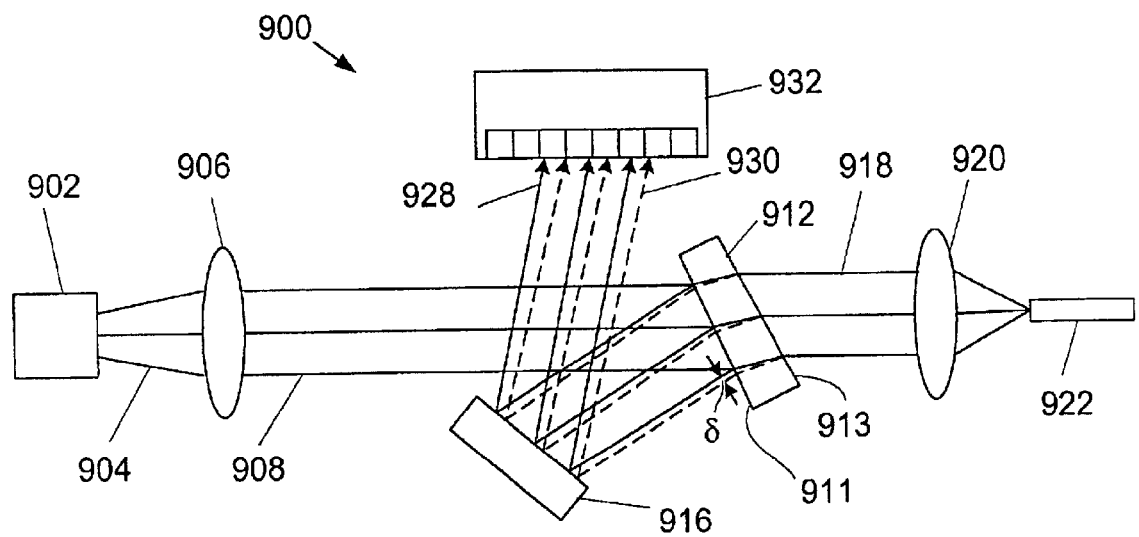
FIGS. 9 and 10 schematically illustrate other approaches to generating an optical signal used for wavelength locking using a reflective wedge mirror according to the present invention.

Another embodiment of a wavelength detector unit 900 is schematically illustrated in FIG. 9. In this embodiment, light 904 diverges from a laser 902 and is substantially collimated by a focusing unit 906. The collimated beam 908 passes through a NPE 912 that reflects light from both surfaces 911 and 913. In the illustrated embodiment, the NPE 912 is a reflective wedge, although it may also include one or more curved surfaces. The light 918 that is not reflected by the NPE 912 may be focused by a lens unit 920 to an output fiber 922.

The light 928 (solid lines) reflected from the first surface 911 and the light 930 (dashed lines) reflected from the second surface 913 may be reflected by a reflector 916 to the detector unit 932. The detector unit 932 has three or more pixels 934 to detect the interference pattern caused by the interference between the reflected light beams 928 and 930.

In one particular embodiment, the NPE 912 may be formed from BK7 glass having a refractive index of 1.51 at the design wavelength of 1.55 μm. A wedge angle of 0.2° produces a fringe spacing in the resultant interference pattern of about 150 μm. A thickness of 1 mm gives an FSR of 100 GHz, while a thickness of 2 mm gives an FSR of 50 GHz. The reflectivity of the surfaces 911 and 913 may be in the range of approximately 1%–2% in order to reduce insertion loss in the beam 918. The reflectivity may be less than 1%, so long as the minimum power requirements of the detector unit 932 are satisfied. Higher values of reflectivity may not provide significant benefit in terms of signal to noise or reduction of higher order reflections, but do increase the insertion loss.

The angle of incidence on the NPE 912 may be around 15°, although any suitable angle may be used, depending on the beam diameter and the thickness of the NPE 912. Where the beam diameter is fixed, a thicker NPE 912 is advantageously tilted at a smaller angle, to ensure good overlap between the beams reflected from the two surfaces 911 and 913. Since the reflectivity of the surfaces 911 and 913 is typically low, any interference or etalon effects in the beam 918 transmitted to the output fiber 922 resulting from the NPE 912 may be regarded as being insignificant.

One of the advantages of placing the NPE 912 directly in the beam 908 is that all light reflected out of the beam 908 by the NPE 912 is incident on the detector unit 932, and therefore the use of the tapped light is very efficient. This contrasts, for example, with the embodiment illustrated in FIG. 3, where light transmitted through the NPE 316 is not used for measuring the wavelength of the light. Furthermore, passing the light 328 and 330 through the beamsplitter 312 results in additional losses.

Figure 10:
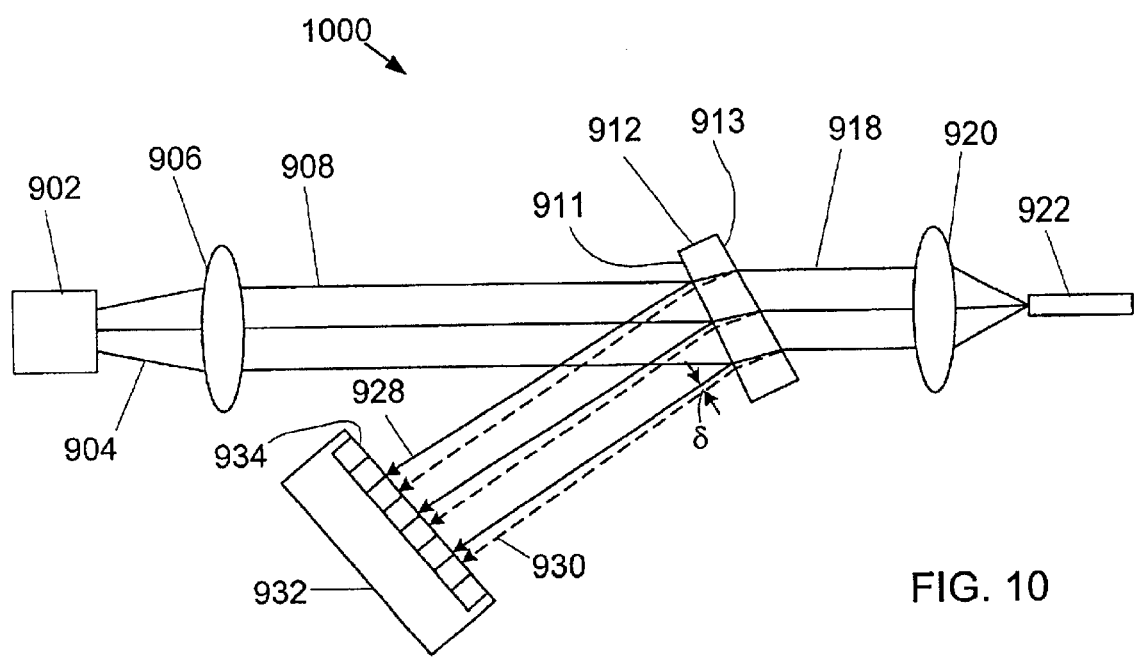

Another embodiment of wavelength detector unit 1000 is illustrated in FIG. 10. Here, the folding mirror 916 has been omitted and the light 928 and 930 reflected by the NPE 912 is incident directly on the detector unit 932. The detector unit 932 is positioned sufficiently far from the NPE 912 that the detector unit 932 receives the reflected light 928 and 930 but does not occlude any of the light 908 incident on the NPE 912.

The interference pattern from the two reflected beams 928 and 930 occurs only where the two beams 928 and 930 overlap. Reflection in a reflective wedge results in a displacement, δ, between the beam reflected from the first surface and the beam reflected from the second surface, given by $\delta=2t\alpha/n_0$, where t is the etalon thickness, α is the incident angle, and $n_0$ is the refractive index of the reflective wedge. In the expression for δ, it has been assumed that the wedge angle of the NPE 912 is sufficiently small that the contribution to δ from the wedged shape of the wedge may be neglected.

For a 1 mm thick glass etalon at an angle of incident of 15°, the displacement is about 330 μm, and so the interference pattern has a width of about 670 μm. Such an etalon has a FSR of 100 MHz. To increase the resolution of the wavelength locker, in other words decreasing the FSR, the incident angle α is reduced to allow for a thicker etalon while maintaining the same width of the interference pattern. Another approach is to use an optically denser etalon material. Reducing α, however, increases the length of the wavelength locker since the detector unit 932 must be placed further away from the etalon in order not to shade the incoming light 908. By using a folding mirror 916, the overall length requirement can be some what reduced.

In general, the wedge angle of the NPE 912 is small, in many cases less than 1°, and so the walk-off between the two beams 928 and 930 propagating from the NPE 912 to the detector unit 932 is very small, if not negligible. Therefore, although they have been described as separate beams, the reflected beams 928 and 930 may together be regarded as a single beam, derived from the output beam 980 of the laser, that contains an interference pattern.

Figure 11:
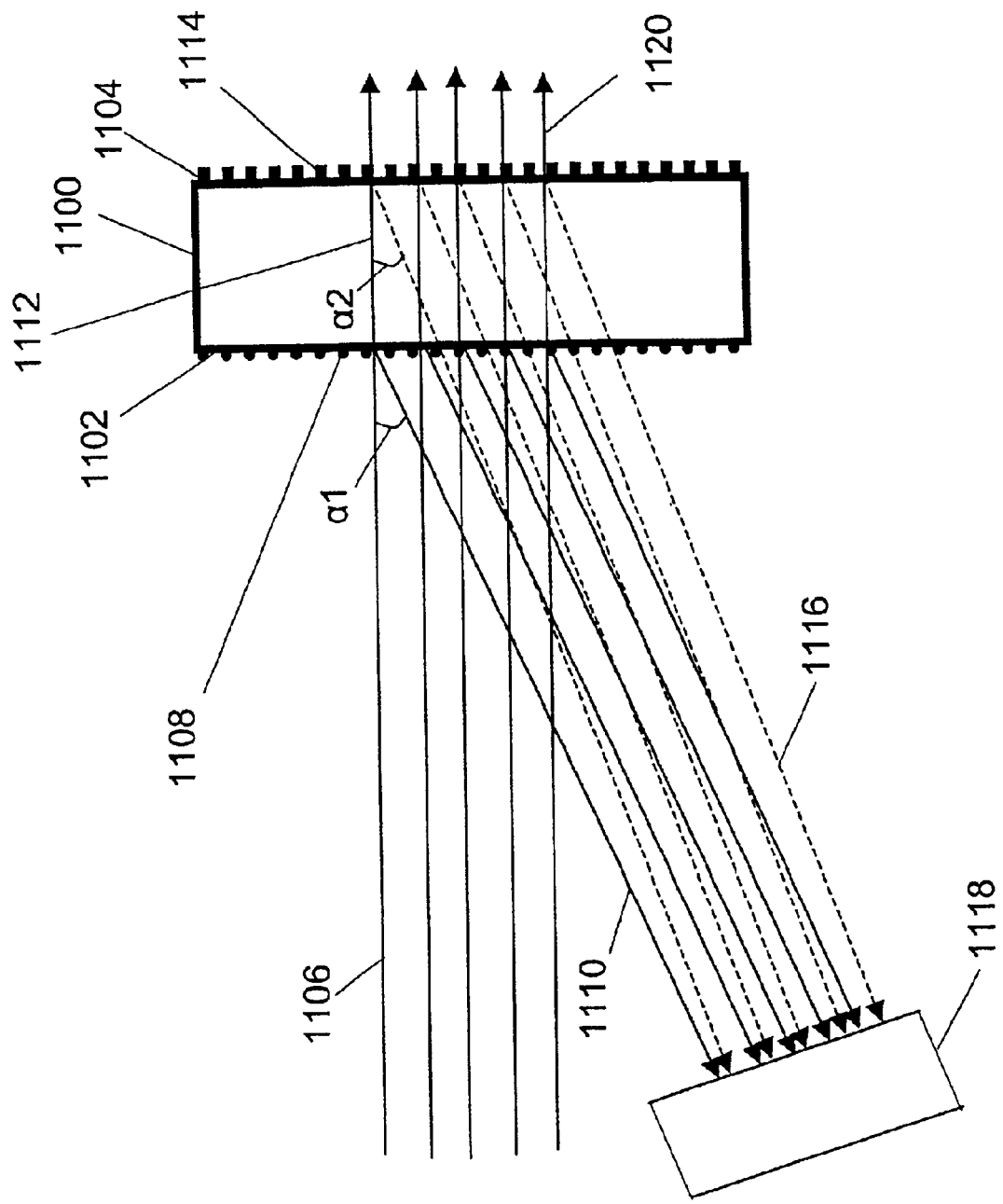
FIG. 11 schematically illustrates a diffractive NPE according to an embodiment of the invention.

Another embodiment of reflector that may be used in the wavelength locker is schematically illustrated in FIG. 11. The reflector is a diffractive etalon 1100 having a first side 1102 and a second side 1104. The first and second sides 1102 and 1104 may or may not be parallel to each other. The light 1106 from the laser to be wavelength locked is incident on the first side 1102. A diffracting structure 1108, having a grating period $d_1$, is disposed on the first side 1102, so that a portion of the incident light 1106 is diffracted as beam 1110 (solid lines), at an angle $\alpha_1$ to the incident light 1106.

The light 1112 that is transmitted through the first side 1102 is incident on the second side 1104. The second side 1104 is provided with a second diffracting structure 1114, having a grating period $d_2$, so that some of the light incident on the second side 1104 is diffracted as beam 1116 (dashed lines) at an angle $\alpha_2$ relative to the incident light 1106.

The two beams 1110 and 1116 overlap and interfere to cause a fringe pattern that may be detected by a multi-element detector unit 1118 to produce detection signals that are used for determining the wavelength of the light 1106.

The diffractive etalon 1100 produces two beams 1110 and 1116 that propagate in different directions and, therefore, may be considered to be a wedged reflector, even though the two surfaces 1102 and 1104 may be parallel. It will be appreciated that the light 1106 incident on the diffractive etalon 1100 need not be incident at normal incidence.

The diffracting structures 1108 and 1114 may reflectively diffract, as illustrated in FIG. 11, in which case the diffractive etalon 1100 may be used in the embodiments of wavelength locker similar to those illustrated in FIGS. 3, 9 and 10. The diffracting structures 1108 and 1114 may also diffract in transmission, rather than reflection, in which case the diffractive etalon 1100 may be employed in other configurations.

Figure 12:
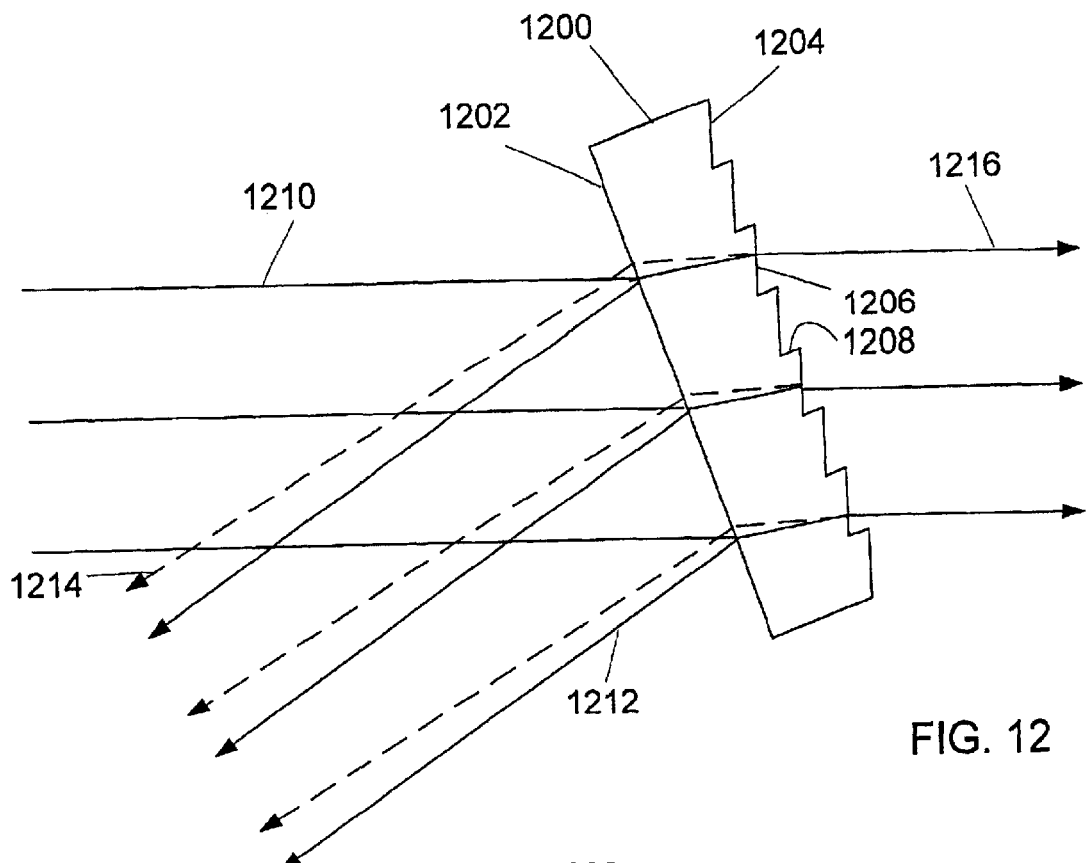
FIG. 12 schematically illustrates a Fresnel NPE according to an embodiment of the invention.
Figure 13:
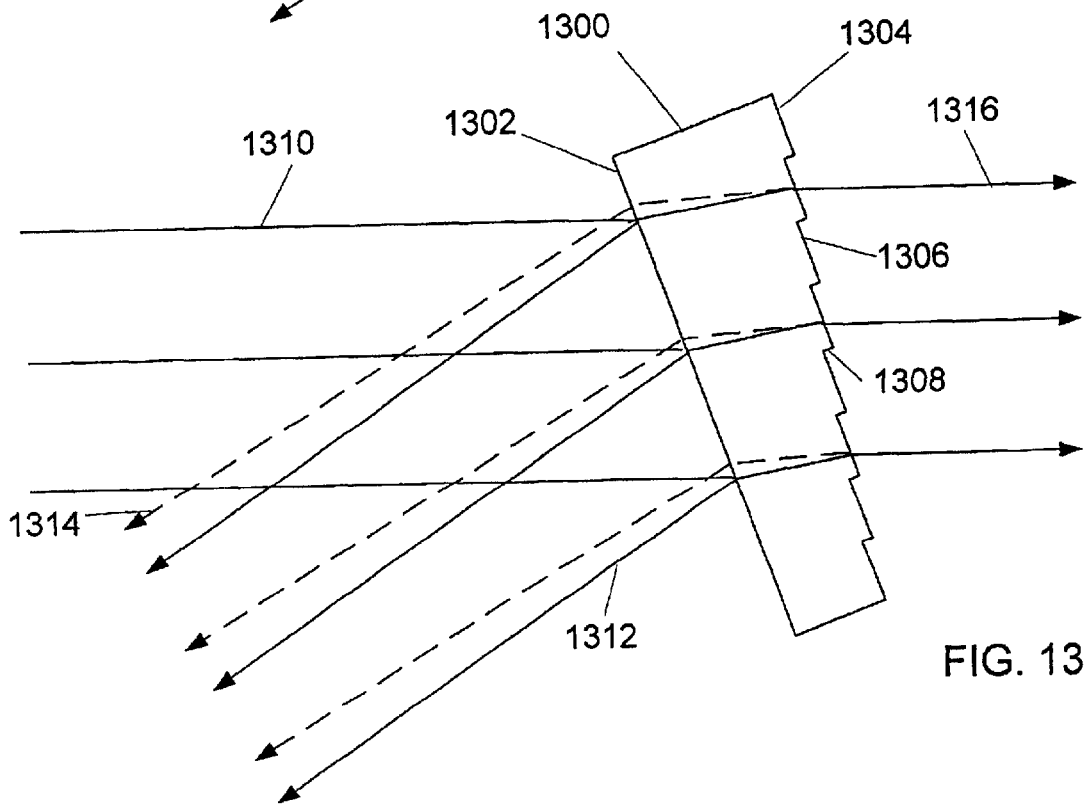
FIG. 13 schematically illustrates a binary NPE according to an embodiment of the invention.

Two other types of fringe-producing optical elements that may be used in the present invention are illustrated in FIGS. 12 and 13. A Fresnel etalon 1200, illustrated in FIG. 12, is a NPE that may be used in a wavelength locker. The Fresnel etalon 1200 has first and second surfaces 1202 and 1204. One of the surfaces, the second surface 1204 in the illustrated example, includes a ridged pattern of long surfaces 1206 and short surfaces 1208. The long surfaces 1206 are not parallel to the first surface 1202, but are at an angle relative to the first surface 1202. The long surfaces 1206 may be flat or curved. The average thickness across the Fresnel etalon 1200 may be constant, or may vary. It will be appreciated that one or both of the surfaces 1202 and 1204 may be provided with a ridged pattern of long and short surfaces.

In use, light 1210 is incident on the Fresnel etalon 1200. The first surface 1202 reflects a portion of the light 1210 as beam 1212 (solid lines) and the second surface reflects a portion of the light 1210 as beam 1214 (dashed lines). The light that is not reflected by either the first or second surfaces 1202 and 1204 is transmitted as beam 1216. The two reflected beams 1212 and 1214 overlap and interfere, causing an interference pattern that may be detected by a detector unit.

A binary etalon 1300, illustrated in FIG. 13, is a NPE that may be used in a wavelength locker. The binary etalon 1300 has first and second surfaces 1302 and 1304. One of the surfaces, the second surface 1304 in the illustrated example, includes a stepped pattern of long surfaces 1306 and short surfaces 1308. The long surfaces 1306 are parallel to the first surface 1302, while the short surfaces 1308 are not parallel to the first surface 1302. The average thickness across the binary etalon 1300 varies from one side of the etalon 1300 to the other. It will be appreciated that one or both of the surfaces 1302 and 1304 may be provided with a stepped pattern of long and short surfaces.

In use, light 1310 is incident on the binary etalon 1300. The first surface 1302 reflects a portion of the light 1310 as beam 1312 (solid lines) and the second surface reflects a portion of the light 1310 as beam 1314 (dashed lines). The light that is not reflected by either the first or second surfaces 1302 and 1304 is transmitted as beam 1316. The two reflected beams 1312 and 1314 overlap and interfere, causing an interference pattern that may be detected by a detector unit.

The Fresnel etalon 1200 and the binary etalon 1300 may be used in different configurations of wavelength locker. For example, the Fresnel etalon 1200 or binary etalon 1300 may be used in a wavelength locker where light is first split from the output beam of the laser to form a second beam that is subsequently incident on the etalon 1200 or 1300. One example of such a configuration is shown in FIG. 3. The Fresnel etalon 1200 or binary etalon 1300 may also be placed directly in the output beam of the laser, for example as is illustrated in the configurations shown in FIGS. 9 and 10.

Other types of fringe-producing optical elements may be used. For example, an etalon may have flat and parallel surfaces and have a refractive index that is not uniform across the etalon. One example of such an etalon is a gradient index (GRIN) lens. The variation in refractive index, however, need not be radial from an axis, as is commonly found in a GRIN lens. The refractive index of the non-uniform index etalon may increase from one side of the etalon to the opposite side. Furthermore, the profile of the refractive index variation may be linear, parabolic, or may be any suitable function of distance across the etalon that results in a fringe pattern being formed in the reflected light. The refractive index may also vary through the etalon, in a direction along the direction of light propagation through the etalon.

As noted above, the present invention is applicable to wavelength locking of tunable lasers, and is believed to be particularly useful for locking the wavelength of semiconductor lasers used for optical communications. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A laser system, comprising:
   a laser capable of producing a beam of output light;
   a detector unit;
   a fringe-producing optical element disposed in the beam of output light to direct a first portion of the beam of output light to the detector unit as a second light beam, the fringe-producing optical element comprising one of a diffractive etalon or a non-parallel etalon, the non-parallel etalon comprising one of a non-planar etalon or a Fresnel etalon, an interference fringe pattern being produced in the second light beam by the fringe-producing optical element, a second portion of the output light beam, different from the first portion, propagating from the fringe-producing optical element; and a control unit coupled to receive detector information front the detector unit and coupled to the laser to control the wavelength of the beam of output light in response to the information received from the detector unit.

2. A system as recited in claim 1, wherein the laser is a semiconductor laser.

3. A system as recited in claim 1, further comprising a light beam collimator disposed on the beam of output light between the laser and the fringe producing element so that the output light beam at the fringe-producing element is substantially collimated.

4. A system as recited in claim 1, wherein the second light beam includes a first component from a first side of the fringe-producing optical element and a second component from a second side of the fringe-producing optical element, the interference fringe pattern being produced by interference between the first and second components.

5. A system as recited in claim 1, wherein the detector unit has at least three detector elements illuminated by respective portions of the interference fringe pattern.

6. A system as recited in claim 5, wherein the respective portions of the interference pattern correspond to regions of different phase of the interference fringe pattern.

7. A system as recited in claim 6, wherein there are n detector elements, n being greater than two, and the regions of different phase of the interference fringe pattern are spaced apart by approximately $2\pi/n$.

8. A system as recited in claim 1, further comprising a reflector disposed between the fringe-producing element and the detector unit to reflect the second light beam from the fringe-producing element to the detector unit.

9. A system as recited in claim 1, wherein the fringe-producing optical element reflects the second light beam to the detector unit.

10. A system as recited in claim 1, wherein the fringe-producing optical element transmits the second light beam to the detector unit.

11. A system as recited in claim 1, further comprising an output optical fiber and a focusing unit disposed to focus the second portion of the output light beam into the optical fiber.

12. A system as recited in claim 1, further comprising a control unit coupled to receive light detection information from the detector unit and to determine an output power of the laser, the control unit further being coupled to the laser to stabilize the output power of the laser to a desired power level.

13. A system as recited in claim 1, wherein the control unit determines a shift of an operating wavelength of the laser from a desired wavelength, the control unit being coupled to the laser to tune the operating wavelength of the laser to the desired wavelength.

14. A system as recited in claim 1, wherein the second light beam has a power level of no more than about 10% of a power level of the output light beam incident on the fringe-producing element.

15. An optical communications system, comprising;

an optical communications transmitter unit having one or more laser units, at least one of the one or more laser units producing a laser output beam and having a wavelength stabilizing unit, the wavelength stabilizing unit including a detector unit, a fringe-producing optical element disposed in the laser output beam to direct a first portion of the laser output beam to the detector unit as a second light beam, the fringe-producing optical element comprising one of a diffractive etalon or a non-parallel etalon, the non-parallel etalon comprising one of a non-planar etalon or a Fresnel etalon, the fringe-producing optical element causing an interference fringe pattern in the second light beam, a second portion of the output light beam propagating from the fringe-producing optical element, and a control unit coupled to receive detection signals from the detector unit and adapted to generate a laser frequency control signal for controlling wavelength of the at least one of the one or more laser units, an optical communications receiver unit; and an optical fiber communications link coupled to transfer light from the second portion of the output light beam from the optical communications transmitter unit to the optical communications receiver unit.

16. A system as recited in claim 15, further comprising a series of fiber amplifiers disposed on the optical fiber communications link, the series of fiber amplifiers including at least one fiber amplifier unit.

17. A system as recited in claim 15, wherein the optical communications transmission unit includes at least two laser units operating at different wavelengths and further comprising wavelength division multiplexing elements to combine light output from the at least two laser units to produce a multiple channel optical communications signal coupled to the optical fiber communications link.

18. A system as recited in claim 17, wherein the optical communications receiver unit includes wavelength division demultiplexing elements to separate the multiple channel optical communications signal into signal components of different wavelengths and further includes channel detectors to detect respective signal components.

19. A method of stabilizing an operating frequency of an output light beam produced by a laser, the method comprising:

splitting a first portion from the output light beam as a second light beam using a fringe-producing optical element, the fringe-producing optical element causing an interference fringe pattern in the second light beam, the fringe-producing optical element comprising one of a diffractive etalon or a non-parallel etalon, the non-parallel etalon comprising one of a non-planar etalon or a Fresnel etalon;

detecting portions of the interference fringe pattern using a detector unit;

producing detector signals in response to the detected portions of the interference fringe pattern;

generating a frequency control signal in response to the detector signals;

tuning the laser in response to the frequency control signal so that the operating frequency of the output light beam is substantially at a desired value; and propagating a second portion of the output light beam, different from the first portion, from the fringe-producing optical element.

20. A method as recited in claim 19, wherein deflecting the portion of the output light beam includes reflecting the portion of the output light beam using the fringe-producing optical element.

21. A method as recited in claim 19, wherein deflecting the portion of the output light beam includes transmitting the portion of the output light beam through the fringe-producing optical element.

22. A method as recited in claim 21, wherein the fringe-producing optical element is a diffractive etalon.

23. A method as recited in claim 19, wherein deflecting the portion of the output light beam includes deflecting no more than about 10% of the output tight beam.

24. A method as recited in claim 19, wherein deflecting the portion of the output light beam includes deflecting a first component from a first side of the fringe-producing optical element and deflecting a second component from a second side of the fringe-producing optical element, the second beam including the first and second components.

25. A method as recited in claim 19, wherein detecting the portions of the interference fringe pattern include detecting at least three different portions of the interference fringe pattern.

26. A method as recited in claim 25, wherein the at least three different portions of the interference fringe pattern correspond to regions of different phase of the interference pattern.

27. A method as recited in claim 26, wherein the regions of different phase of the interference fringe pattern are selected from more than one period of the interference fringe pattern.

28. A method as recited in claim 25, wherein the detector unit has n detector elements that detect respective portions of the interference pattern spaced apart by approximately $2\pi/n$.

29. A method as recited in claim 19, wherein generating the frequency control signal includes generating phase signals from the detector signals, and generating transformed phase signals using the phase signals and reference phase signals.

30. A method of stabilizing an operating frequency of an output light beam produced by a laser, the method comprising:

splitting a first portion from the output light beam as a second light beam using a fringe-producing optical element, the fringe-producing optical element comprising one of a diffractive etalon or a non-parallel etalon, the non-parallel etalon comprising one of a non-planar etalon or a Fresnel etalon, the fringe-producing optical element causing an interference fringe pattern in the second light beam, a remainder of the output light beam after splitting the first portion being a second portion of the output light beam; and stabilizing the operating frequency of the output light beam using the interference fringe pattern.

31. A method as recited in claim 30, wherein deflecting the portion of the output light beam includes reflecting the portion of the output light beam using the fringe-producing optical element.

32. A method as recited in claim 30, wherein deflecting the portion of the output light beam includes transmitting the portion of the output light beam through the fringe-producing optical element.

33. A method as recited in claim 32, wherein the fringe-producing etalon is a diffractive etalon.

34. A method as recited in claim 30, wherein deflecting the portion of the output light beam includes deflecting no more than about 10% of the output light beam.

* * * * *